(12) United States Patent
Radic

(10) Patent No.: US 11,277,068 B2
(45) Date of Patent: Mar. 15, 2022

(54) SWITCHED-MODE POWER CONTROLLER WITH MULTI-MODE STARTUP

(71) Applicant: Appulse Power Inc., Toronto (CA)

(72) Inventor: Aleksandar Radic, Toronto (CA)

(73) Assignee: Appulse Power Inc., Toronto (CA)

( * ) Notice: Subject to any disclaimer, the term of this patent is extended or adjusted under 35 U.S.C. 154(b) by 12 days.

(21) Appl. No.: 16/694,679

(22) Filed: Nov. 25, 2019

(65) Prior Publication Data

US 2020/0091824 A1 Mar. 19, 2020

Related U.S. Application Data

(63) Continuation of application No. 16/146,615, filed on Sep. 28, 2018, now Pat. No. 10,491,125.

(Continued)

(51) Int. Cl.
| | |
|---|---|
| *H02M 3/335* | (2006.01) |
| *H02M 1/36* | (2007.01) |
| *H03K 7/08* | (2006.01) |
| *H02M 7/12* | (2006.01) |
| *H02M 1/00* | (2006.01) |

(52) U.S. Cl.
CPC ......... *H02M 3/33515* (2013.01); *H02M 1/36* (2013.01); *H03K 7/08* (2013.01); *H02M 1/0009* (2021.05); *H02M 1/0058* (2021.05); *H02M 7/12* (2013.01)

(58) Field of Classification Search
CPC ......... H02M 5/40; H02M 5/42; H02M 5/453; H02M 5/458; H02M 2001/0009; H02M 2001/0054; H02M 2001/0058; H02M 2001/0025; H02M 2001/0016; H02M 2001/0019; H02M 1/32; H02M 1/36; H02M 1/44; H02M 1/08; H02M 1/083; H02M 3/335; H02M 1/4258; H02M 3/33515;

(Continued)

(56) References Cited

U.S. PATENT DOCUMENTS

| | | | |
|---|---|---|---|
| 7,863,869 B1 * | 1/2011 | De Stasi | H02M 3/156 323/222 |
| 9,698,695 B1 * | 7/2017 | Fahlenkamp | H02M 1/32 |

(Continued)

OTHER PUBLICATIONS

Notice of Allowance dated Jul. 25, 2019 for U.S. Appl. No. 16/146,615.
Office Action dated Mar. 7, 2019 for U.S. Appl. No. 16/146,615.

*Primary Examiner* — Gustavo A Rosario-Benitez
(74) *Attorney, Agent, or Firm* — MLO, a professional corp.

(57) ABSTRACT

A switched-mode power controller includes a primary side controller circuit configured in a startup mode of operation to generate a fixed switching frequency pulse width modulation (PWM) signal with incrementing duty-ratio value. The PWM signal drives a main-switch that charges an inductive device with stored energy and discharges the stored energy into a capacitor on a secondary side to generate a power controller output voltage. Based on a comparison of the power controller output voltage with a reference voltage, the primary side controller circuit is configured to stop the incrementing of the duty-ratio of the PWM signal and begin a quasi-resonant mode of operation during which the primary side controller circuit reduces a number of valleys detected in one or more off-times of the main-switch in one or more respective main-switch switching periods.

20 Claims, 5 Drawing Sheets

Related U.S. Application Data

(60) Provisional application No. 62/629,337, filed on Feb. 12, 2018.

(58) Field of Classification Search
CPC ......... H02M 3/33507; H02M 3/33523; H02M 7/12; H03K 7/08
See application file for complete search history.

(56) References Cited

U.S. PATENT DOCUMENTS

| | | | |
|---|---|---|---|
| 9,985,522 B1 | 5/2018 | Luft et al. | |
| 10,003,248 B1 | 6/2018 | Malinin | |
| 2009/0273324 A1* | 11/2009 | Okamoto | H02M 1/36 323/282 |
| 2012/0206064 A1 | 8/2012 | Archenhold | |
| 2012/0299561 A1 | 11/2012 | Chen et al. | |
| 2013/0235621 A1 | 9/2013 | Fan et al. | |
| 2013/0249519 A1* | 9/2013 | Zhao | G05F 1/46 323/284 |
| 2014/0133186 A1 | 5/2014 | Balakrishnan et al. | |
| 2014/0159641 A1* | 6/2014 | Geren | H02M 1/32 320/106 |
| 2014/0246988 A1 | 9/2014 | Chen | |
| 2014/0253072 A1* | 9/2014 | Hussien | H02M 1/36 323/281 |
| 2015/0062981 A1 | 3/2015 | Fang et al. | |
| 2015/0162272 A1 | 6/2015 | Balakrishnan et al. | |
| 2015/0194875 A1* | 7/2015 | Jutras | H02M 1/36 363/49 |
| 2015/0244272 A1 | 8/2015 | Schaemann et al. | |
| 2015/0249380 A1 | 9/2015 | Hayakawa et al. | |
| 2015/0256060 A1* | 9/2015 | Faingersh | H02M 1/36 323/267 |
| 2015/0256227 A1 | 9/2015 | Teggatz et al. | |
| 2016/0141951 A1 | 5/2016 | Mao et al. | |
| 2016/0156273 A1* | 6/2016 | Baurle | H02M 3/33507 363/21.13 |
| 2016/0172989 A1 | 6/2016 | Lee et al. | |
| 2017/0019020 A1* | 1/2017 | Tsuchimoto | H02M 1/32 |
| 2017/0214325 A1 | 7/2017 | Chang et al. | |
| 2017/0366102 A1 | 12/2017 | Kikuchi | |
| 2017/0373606 A1* | 12/2017 | Lin | H02M 3/24 |
| 2018/0019677 A1 | 1/2018 | Chung et al. | |
| 2018/0076721 A1 | 3/2018 | Cannenterre et al. | |
| 2018/0309385 A1 | 10/2018 | Ho et al. | |
| 2018/0316273 A1 | 11/2018 | Chen et al. | |
| 2018/0323717 A1* | 11/2018 | Chang | H02M 1/36 |
| 2019/0115835 A1* | 4/2019 | Cohen | H02M 3/1588 |
| 2019/0317141 A1* | 10/2019 | Karlsson | H02M 1/36 |
| 2020/0195149 A1* | 6/2020 | Mayell | H02M 3/33507 |

* cited by examiner

SWITCHED-MODE POWER CONTROLLER WITH MULTI-MODE STARTUP

RELATED APPLICATIONS

This application is a continuation of U.S. patent application Ser. No. 16/146,615, filed on Sep. 28, 2018, which claims priority to U.S. Provisional Patent Application No. 62/629,337, filed on Feb. 12, 2018, and entitled "Flyback Digital Controller," all of which are hereby incorporated by reference for all purposes.

BACKGROUND

Switched-mode power controllers or converters may be designed in a wide variety of different ways and may use a variety of different control mechanisms to convert an input current into an output current (e.g., convert an input alternating current to an output direct current, or convert an input direct current level to a different output direct current level). In operation, a quasi-resonant switched-mode power controller typically provides a pulse-width modulation (PWM) signal that periodically turns on and off a power switch. The power switch typically supplies current to an inductive device (e.g., an inductor or transformer). The time between two rising edges of the PWM signal corresponds to a switching cycle that consists of an on-time and an off-time. The inductive device magnetizes during the on-time and demagnetizes during the off-time.

At the completion of demagnetization, the inductive and parasitic capacitance components induce a quasi-resonant oscillating signal that includes valleys at times when the voltage across the power switch is zero or minimum value. Some quasi-resonant switched-mode power controllers are designed to minimize switching losses by turning the power switch on at selected valley times during off-time cycles (referred to as "zero-voltage valley switching"). In this process, the quasi-resonant switched-mode power converter typically includes a valley detection circuit that produces a valley signal for each valley detected in the oscillating auxiliary winding signal.

Based on a comparison of the output voltage of the quasi-resonant switched-mode power controller with a reference voltage, a compensation circuit typically generates a compensation signal that can be used to regulate the durations of the main-switch on-times and off-times to maintain the output voltage at the target level.

SUMMARY

In accordance with an example, a switched-mode power controller includes a primary side controller circuit configured in a startup mode of operation to generate a fixed switching frequency pulse width modulation (PWM) signal with incrementing duty-ratio value. The PWM signal drives a main-switch that charges an inductive device with stored energy and discharges the stored energy into a capacitor on a secondary side to generate a power controller output voltage. Based on a comparison of the power controller output voltage with a reference voltage, the primary side controller circuit is configured to stop the incrementing of the duty-ratio of the PWM signal and begin a quasi-resonant mode of operation during which the primary side controller circuit reduces a number of valleys detected in one or more off-times of the main-switch in one or more respective main-switch switching periods.

In an example, for each main-switch period, the primary side controller circuit reduces the number of valleys detected by one.

In another example, the primary side controller circuit is configured to stop reducing the number of valleys per main-switch switching period when the reference voltage is greater than the power controller output voltage by a predefined threshold voltage. In an example, the predefined threshold voltage is an error window range of a compensator component of the primary side controller circuit. In an example, the primary side controller circuit is configured to exit the startup mode of operation when the power controller output voltage is greater than the reference voltage.

In an example, a secondary side controller is configured to generate representations of the power controller output voltage and the reference voltage, and send the representations to the primary side controller circuit over a communications link. In an example, the secondary side controller is configured to turn-on before the controller output voltage reaches the reference voltage. In an example, the secondary side controller drives the communications link. In an example, the secondary side controller is configured to generate an encoded digital data stream with digital representations of the output voltage and the reference voltage, and the communications link is a uni-directional high-speed digital data link.

Another example provides a method of operating a switched-mode power controller in a startup mode of operation. In accordance with this method, a primary side controller circuit generates a fixed switching frequency pulse width modulation (PWM) signal with incrementing duty-ratio value to drive a main-switch; wherein the main-switch charges an inductive device with stored energy, and the main-switch discharges the stored energy into a capacitor on a secondary side to generate a power controller output voltage. Based on a comparison of the power controller output voltage with a reference voltage, the primary side controller circuit stops the incrementing of the duty-ratio of the PWM signal and begins a quasi-resonant mode of operation. During the quasi-resonant mode of operation, the primary side controller circuit reduces a detected number of valleys in one or more off-times of the main-switch in one or more respective main-switch switching periods.

An example includes, for each main-switch period, the primary side controller circuit reduces the number of valleys detected by one. In an example, the primary side controller circuit stops the reducing of the number of valleys per main-switch switching period when the reference voltage is greater than the power controller output voltage by a predefined threshold voltage.

In an example, the predefined threshold voltage is an error window range of a compensator component of the primary side controller circuit. In an example, the primary side controller circuit exits the startup mode of operation when the power controller output voltage is greater than the reference voltage.

In an example, a secondary side controller generates representations of the power controller output voltage and the reference voltage, and sends the representations to the primary side controller circuit over a communications link. In some examples, the secondary side controller turns-on before the controller output voltage reaches the reference voltage. In an example, the secondary side controller drives the communications link. In an example, the secondary side controller generates an encoded digital data stream with digital representations of the output voltage and the reference voltage, and the communications link is a uni-directional high-speed digital data link.

In an example, the switched-mode power controller is a flyback converter digital quasi-resonant controller.

Embodiments of the disclosed quasi-resonant switched-mode power controller, converters, and methods provide additional or other advantages to those mentioned above. One skilled in the art will readily appreciate these advantages from the following detailed description together with the following drawings.

DETAILED DESCRIPTION

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the scope thereof. For instance, features illustrated or described as part of one embodiment may be used with another embodiment to yield a still further embodiment. Thus, it is intended that the present subject matter cover all such modifications and variations within the scope of the appended claims and their equivalents.

The disclosure describes a multimode startup method for a quasi-resonant switched-mode power controller that includes a startup ramp mode followed by a valley reduction mode. The initial startup ramp voltage involves increasing the main-switch on-times to enable the power controller components to power-up quickly. The follow-on valley reduction mode decreases the off-times by reducing the number of valleys each period, which effectively increases the on-times. Thus, reducing the number of valleys by one (or more) each switching cycle enables the quasi-resonant switched-mode power converter to have faster startup time while, at the same time, obtaining the benefits of a quasi-resonant mode of operation.

Figure 1:
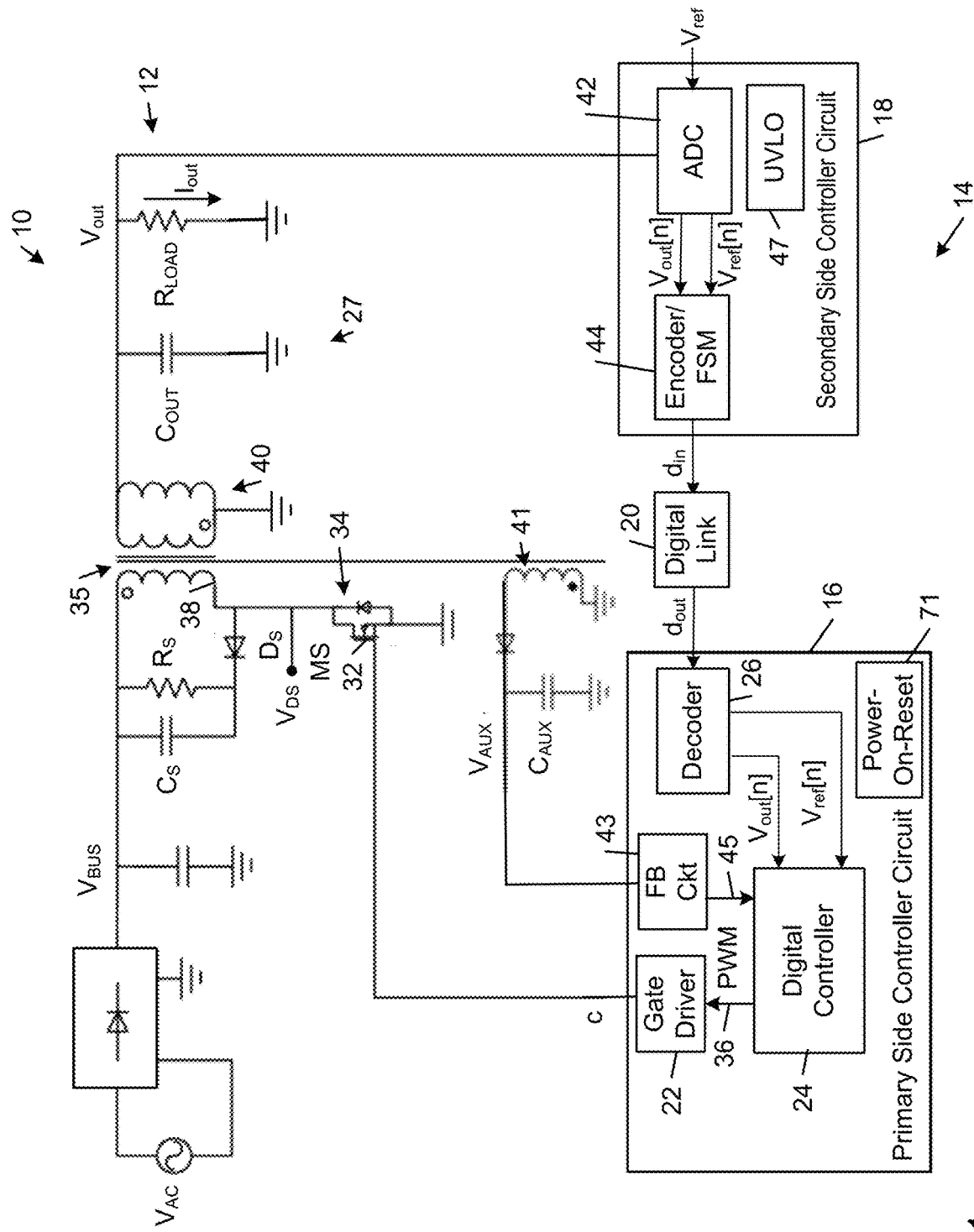
FIG. 1 is a diagrammatic top view of an example quasi-resonant switched-mode power converter and a mixed-signal controller that includes a primary side circuit and a secondary side circuit.

FIG. 1 shows an example quasi-resonant switched-mode power converter 10 that is implemented by an alternating current (AC)/direct current (DC) flyback converter 12 and a mixed-signal controller 14 that includes a primary side controller circuit 16, a secondary side controller circuit 18, and a uni-directional high-speed digital link 20 that transmits digital representations of the changing output voltage and the target reference voltage from the secondary side controller circuit 18 to the primary side controller circuit 16.

The primary side controller circuit 16 includes a gate driver 22, a digital controller 24, a decoder 26, and a power-on-reset (POR) circuit 71. The primary side controller circuit 16 is connected to the gate 32 of a primary side main-switch 34 (MS). The digital controller 24 supplies a low-power pulse width modulation (PWM) signal 36 to the input of the gate driver 22. The gate driver 22 receives the low-voltage PWM signal and produces a high-voltage PWM drive input signal (c) that is applied to the main-switch gate 32 to periodically turn-on and turn-off the high-current main-switch 34. The main-switch 34 controls the current through an inductive device which, in the instant example, is implemented by a transformer 35 that includes a primary winding 38 and a secondary winding 40 which are inductively coupled together when current flows through the main-switch 34.

The quasi-resonant switched-mode power converter 10 converts an input AC voltage ($V_{AC}$) into an output DC voltage ($V_{out}$) and an output DC current ($I_{OUT}$) to power a load ($R_{LOAD}$). In the instant example, the power source is an alternating current voltage ($V_{AC}$) that is rectified to produce the input voltage ($V_{BUS}$). The primary side controller circuit 16 provides the high-voltage PWM input for the high-current main-switch 34 to periodically turn on and off the main-switch 34. The current flowing in the primary winding 38 induces a current in the secondary winding 40 that drives a current through an output circuit 27 to produce the output voltage ($V_{out}$) across the load ($R_{LOAD}$).

In some examples, the quasi-resonant switched-mode power converter 10 also includes an auxiliary winding 41 that is inductively coupled to the primary winding 38 and the secondary winding 40. A feedback circuit 43 component (FB) of the primary side controller circuit 16 receives an auxiliary winding voltage ($V_{AUX}$) across an auxiliary winding capacitor ($C_{AUX}$). The auxiliary winding voltage is correlated with the main-switch on-times. After the transformer or inductor has been demagnetized, the auxiliary winding voltage begins to oscillate between signal peaks and signal valleys. The feedback circuit 43 generates a digital representation of a valley signal 45 for each valley detected in the auxiliary winding voltage ($V_{AUX}$).

The secondary side controller circuit 18 includes an analog-to-digital converter (ADC) 42, an encoder/finite state machine (FSM) 44, and an under-voltage lockout (UVLO) circuit 47. The analog-to-digital converter 42 converts the output voltage ($V_{out}$) and the reference voltage ($V_{ref}$) to digital values (e.g., $V_{out}[n]$, $V_{ref}[n]$) and the encoder/finite state machine 44 encodes the digital values into respective digital representations of the output voltage and the reference voltage (e.g., $d_{in}$). The uni-directional high-speed digital link 20 transmits the encoded digital representations of the changing output voltage and the encoded reference voltage (e.g., clout) to the decoder 26 in the primary side controller circuit 16. The decoder 26 converts the respective digital representations of the output voltage and the reference voltage into digital voltage values (e.g., $V_{out}[n]$, $V_{ref}[n]$) that are input into the digital controller 24 to control the gate driver 22 based on the feedback regarding the current output voltage (Vow) and the current reference voltage ($V_{ref}$).

Figure 2:
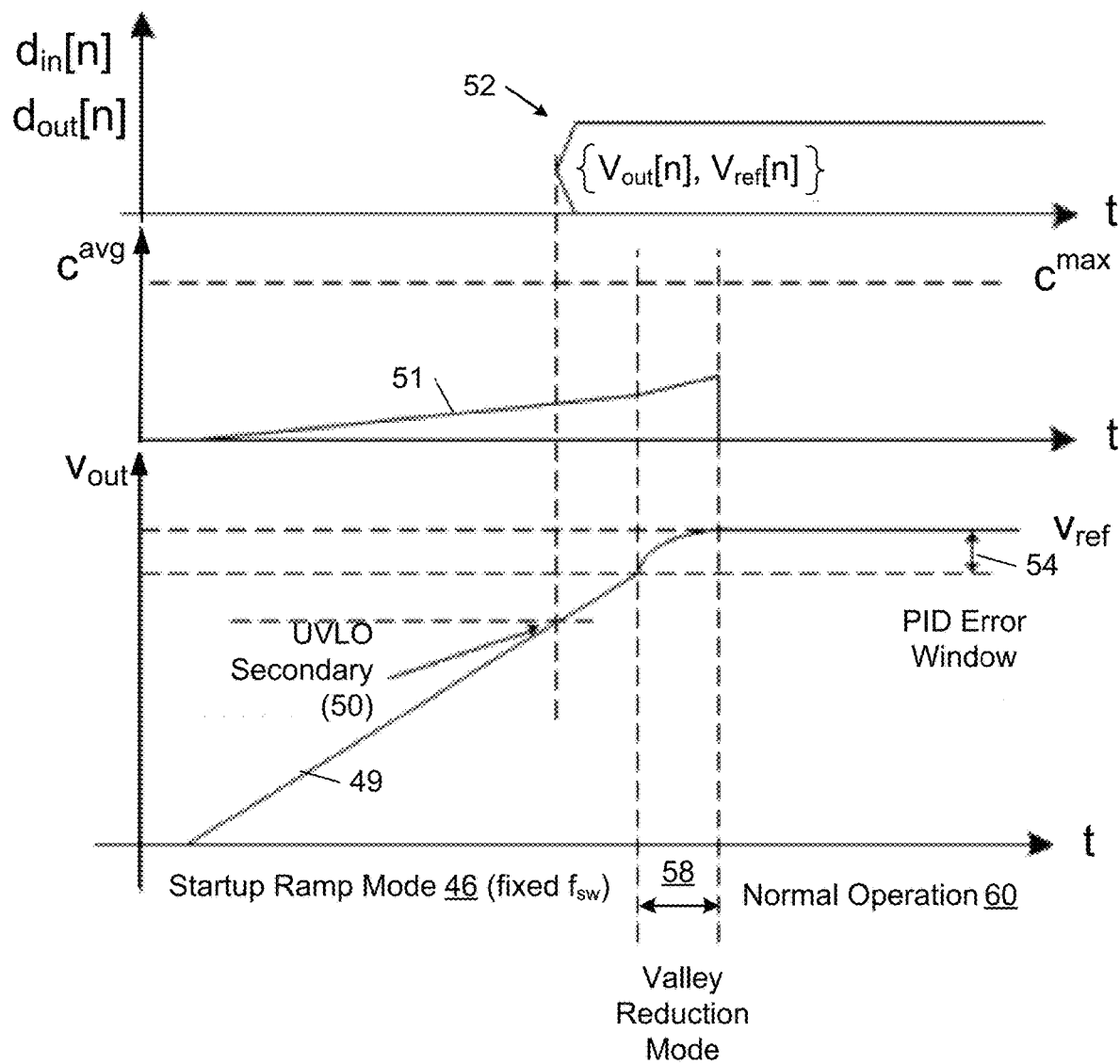
FIG. 2 shows example waveforms for startup output voltage ($V_{out}$), an averaged main-switch (MS) gate-source voltage ($c^{avg}$), and digital link waveforms for the quasi-resonant switched-mode power converter shown in FIG. 1.

FIG. 2 shows graphs of example output waveforms for an output voltage 49 ($V_{out}$), an averaged main-switch (MS) gate-source voltage 51 ($c^{avg}$), and digital link representations 52 (i.e., $\{d_{in}[n], d_{out}[n]\}$) for the quasi-resonant switched-mode power converter 10 shown in FIG. 1.

In an example startup mode of operation 46, the digital controller 24 and gate driver 22 components of the primary side controller circuit 16 generate a fixed switching frequency ($f_{sw}$) PWM signal 36 with increasing duty-ratio value that drives the flyback converter main-switch (MS) switch 34. The switching of the main-switch, in turn, charges the transformer magnetizing inductance of the transformer 35 with the rectified AC input ($V_{BUS}$) and discharges the stored energy into the output voltage capacitor ($C_{OUT}$). The output voltage ($V_{out}$) begins to slowly ramp towards the target reference voltage ($V_{ref}$). After some period, the output voltage ($V_{out}$) reaches an under-voltage lockout (UVLO) threshold 50 of the UVLO circuit 47 enabling the secondary side controller circuit 18 to turn on and also drive the uni-directional digital link 20. In some examples, the secondary side controller circuit 18 does not include a UVLO circuit, in which case the secondary side controller circuit 18 may turn on at an earlier time in the startup ramp mode of operation 46.

As soon as the secondary side controller circuit 18 turns on (e.g., when $V_{OUT}$ reaches UVLO 50) it begins to send digital representations 52 of the changing output voltage and the target reference voltage (i.e., $\{V_{out}[n], V_{ref}[n]\}$) to the uni-directional digital link 20, which transmits encoded versions of the digital representations ($d_{in}$, $d_{out}$) to the decoder 26 component of the primary side controller circuit 16. This information is processed by the digital controller 24 of the primary side controller circuit 16 in such a way that when the output voltage ($V_{out}$) is close to the target reference voltage ($V_{ref}$), the PWM duty-ratio ramp is no longer incremented and the primary side controller circuit 16 switches to a quasi-resonant valley reduction mode 58. In some examples, the primary side controller circuit 16 stops incrementing the PWM duty-ratio ramp when the output voltage ($V_{out}$) is within range of an error window 54 of an internal digital compensator component of the primary side controller circuit 16 that compares the output voltage ($V_{out}$) with the target reference voltage ($V_{ref}$). In some examples, the digital compensator is a proportional-integral-derivative (PID) digital compensation circuit. As long as the difference between the output voltage ($V_{out}$) and the reference voltage ($V_{ref}$) is greater than a pre-defined threshold voltage (e.g., approximately 150 mV in some examples), the primary side controller circuit 16 remains in the quasi-resonant valley reduction mode 58 and continues to reduce the number of valleys in each switching period. In some examples, the number of valleys is reduced by one each switching period. In this way, a smooth and well-controlled transition from startup ramp mode into normal steady-state operation 60 can be achieved, while minimizing startup time and component peak current and voltage stress.

Figure 3:
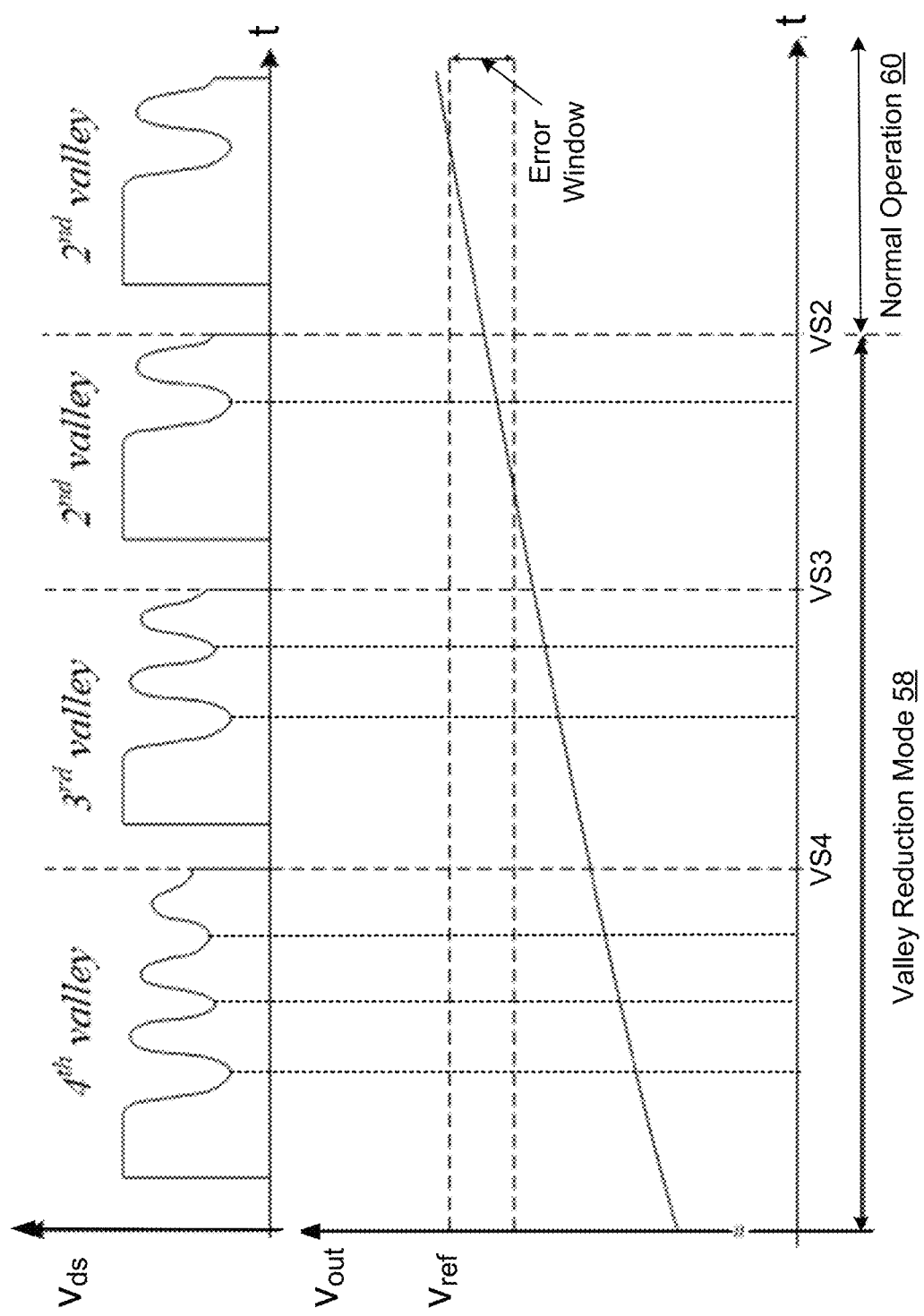
FIG. 3 shows example waveforms of the main-switch (MS) drain-source voltage and the output voltage ($V_{out}$).

FIG. 3 shows example waveforms of the main-switch (MS) drain-source voltage ($Y_{ds}$) and the output voltage ($V_{out}$) during valley reduction mode 58 and normal operation mode 60. In the valley reduction mode 58, the digital controller 24 component of the primary side controller circuit 16 receives from the feedback circuit 43 a respective valley signal 45 for each valley detected in the oscillating auxiliary winding voltage ($V_{AUX}$) that begins after demagnetization completes. During startup, it is generally not possible to detect valleys until the output voltage is high enough. In some examples, after a threshold output voltage has been reached, the primary side controller circuit 16 will determine the number of valleys in the off-time of a period and then begin reducing the number of valleys during the off-times of the switching periods. In some examples, the primary side controller circuit 16 reduces the off-times by reducing the number of valleys by one per switching cycle (e.g., by turning on the main-switch when the valley number is one less than the valley number that was cut off in the preceding period). In some examples, for one or more periods, more than one valley is cut off per switching cycle. Reducing the number of valleys by one (or more) each switching cycle enables the quasi-resonant switched-mode power converter 10 to have faster startup time while, at the same time, obtaining the benefits of a quasi-resonant mode of operation.

In the example shown in FIG. 3, during the valley reduction mode 58, the primary side controller circuit 16 initially turns on the main-switch 34 at a time that coincides with the fourth valley signal (VS4) in a first period in the valley reduction mode 58. In the next period, the primary side controller circuit 16 turns on the main-switch 34 at a time that coincides with the third valley signal (VS3) in a second period in the valley reduction mode 58. In the next period, the primary side controller circuit 16 turns on the main-switch 34 at a time that coincides with the second valley signal (VS2) in a third period in the valley reduction mode 58. The fourth period occurs after the difference between the output voltage (Vow) and the reference voltage ($V_{ref}$) has dropped below the pre-defined threshold voltage (e.g., 150 mV). As a result, the power converter 10 enters the normal mode of operation. In some examples, during the normal mode of operation, the primary side controller circuit 16 turns on the main-switch 34 to coincide with the signal valley number in the valley reduction mode of operation 58 (e.g., $2^{nd}$ valley in the example illustrated in FIG. 3).

Figure 4:
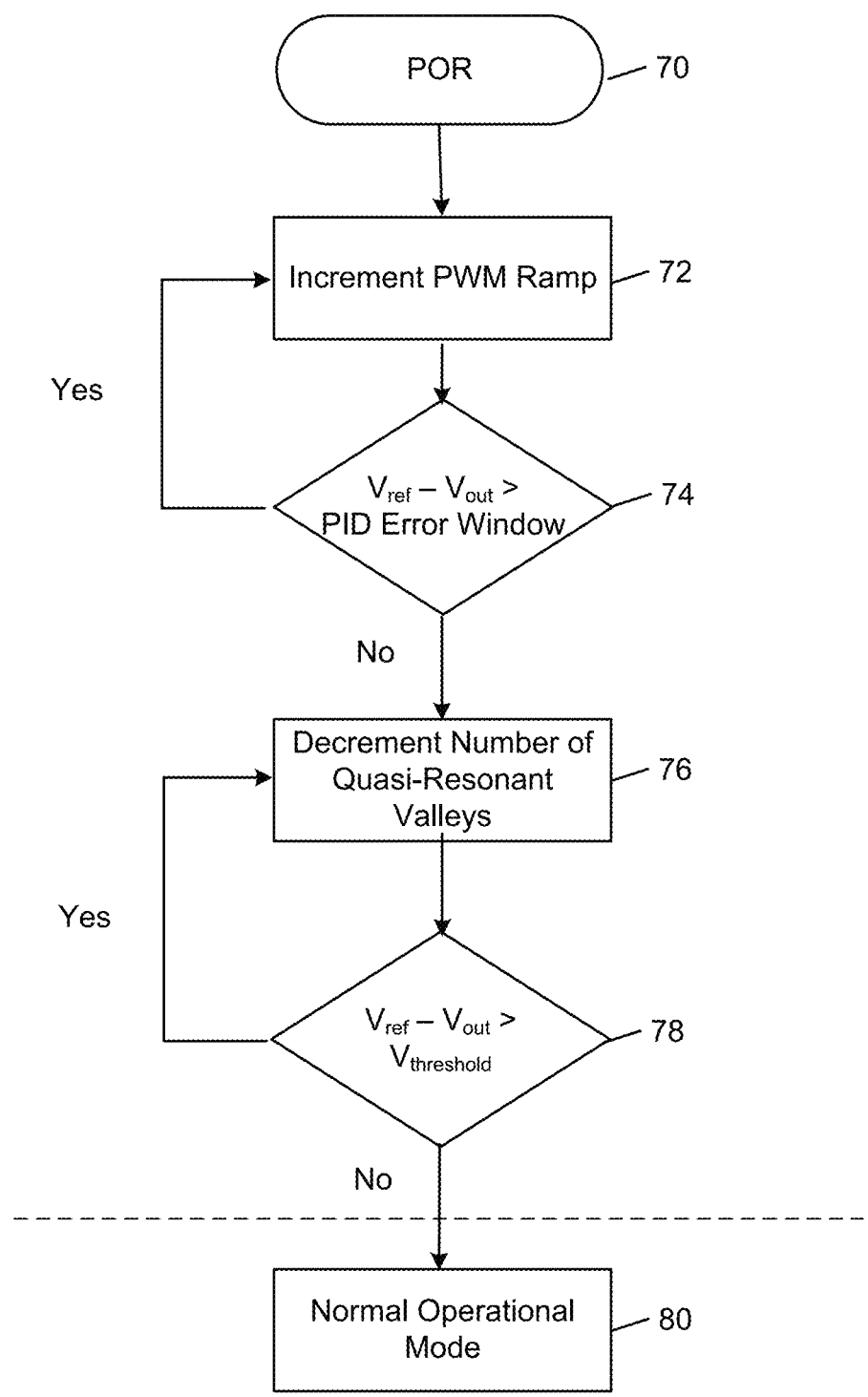
FIG. 4 is a flow diagram of an example startup sequence that is initiated on power-on-reset, where the primary controller comes out of under-voltage lockout.

FIG. 4 is a flow diagram of an example startup sequence that is initiated by receipt of a power-on-reset (POR) signal, where the primary side controller circuit 16 comes out of under-voltage lockout. In accordance with this method, the power-on-reset circuit 71 detects the power applied to the primary side controller circuit 16 and generates a reset impulse that resets the entire circuit 16 to a known state (FIG. 4, block 70). The primary side controller circuit 16 increments the PWM gate driver duty ratio (FIG. 4, block 72). The primary side controller circuit 16 continues to increment the PWM gate driver duty ratio until the difference between the reference voltage ($V_{ref}$) and the output voltage ($V_{out}$) does not exceed the width of the PID error window (FIG. 4, block 74). The primary side controller circuit 16 decrements the number of quasi-resonant valleys (e.g., by one per period) (FIG. 4, block 76). The primary side controller circuit 16 continues to decrement the number of quasi-resonant valleys (e.g., by one per period) until the difference between the reference voltage ($V_{ref}$) and the output voltage (Vow) does not exceed the predetermined threshold (e.g., approximately 150 mV in some examples) (FIG. 4, block 78). When the difference between reference voltage ($V_{ref}$) and the output voltage (Vow) does not exceed the predetermined threshold, the primary side controller circuit 16 enters the normal operational mode (FIG. 4, block 80).

Figure 5:
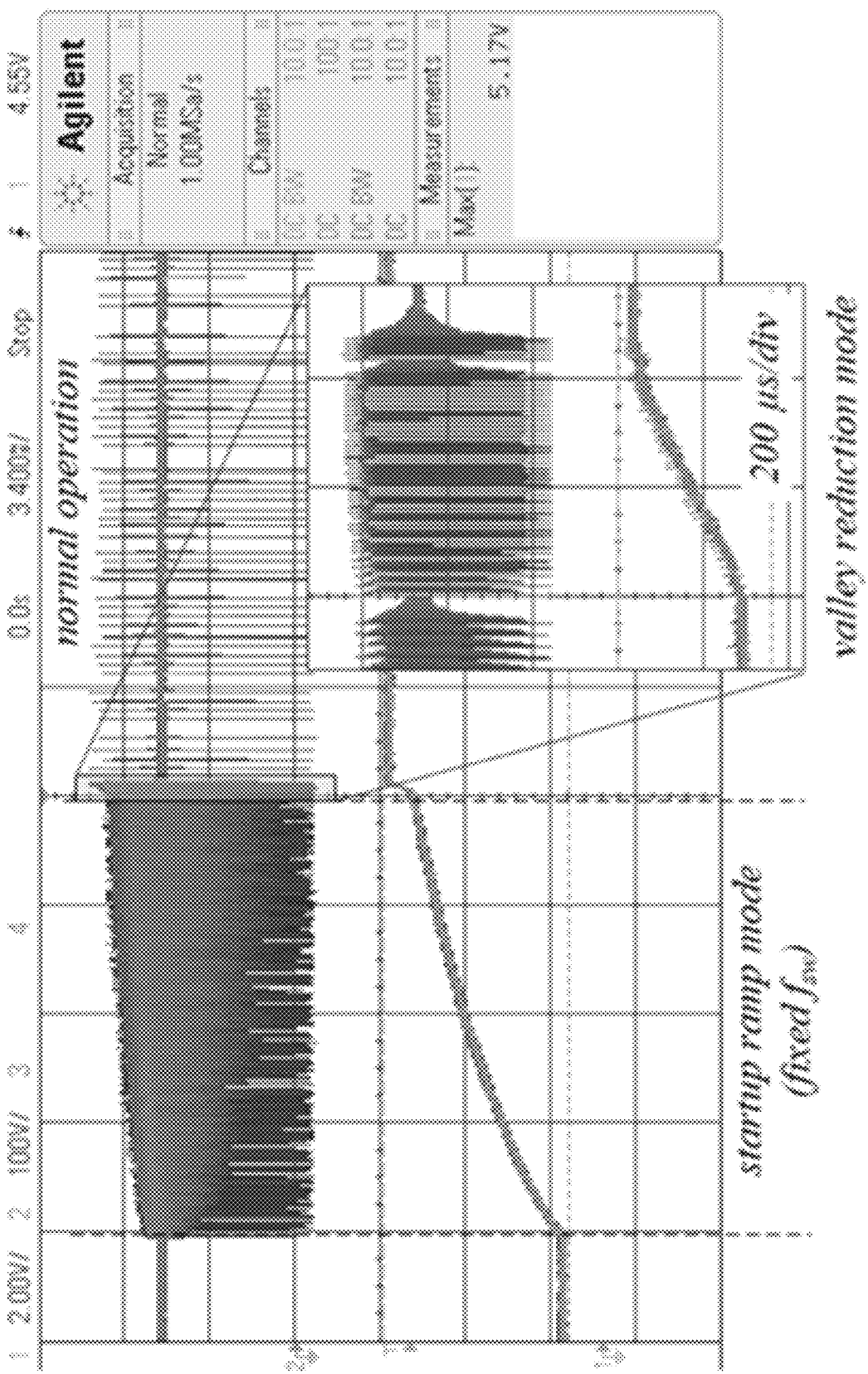
FIG. 5 shows an example of typical output voltage and main-switch drain-source voltage waveforms during startup.

FIG. 5 shows an example of typical output voltage and main-switch drain-source voltage waveforms during startup that illustrates the smooth mode transition made possible by the examples of the quasi-resonant switched-mode power converter 10 that is described herein.

Embodiments of the systems described herein may be used in combination with any switched mode power supply (SMPS) where energy is stored in an inductive device (e.g., a winding, inductor or transformer) during the primary stroke and transferred to the output during the secondary stroke. Examples of such SMPS include a flyback converter, a buck converter and a buck-boost converter.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only and is not intended to limit the invention.

What is claimed is:

1. A controller circuit, comprising:
a digital controller configured to generate, in a first mode of startup operation, a pulse width modulation (PWM) signal with an incrementing on-time duty-ratio value; and
a gate driver circuit configured to control a main-switch of a power converter using the PWM signal;
wherein, the digital controller is further configured to:
receive an indication of an output voltage of the power converter;
exit the first mode of startup operation when a difference between a reference voltage and the indication of the output voltage is not greater than an error window;
generate, in a second mode of startup operation, the PWM signal with a decreasing off-time duty-ratio value; and
exit the second mode of startup operation when a difference between the reference voltage and the indication of the output voltage is not greater than a predefined threshold voltage.

2. The controller circuit of claim 1, wherein:
the digital controller is further configured to stop decreasing the off-time duty-ratio value of the PWM signal when the digital controller exits the second mode of startup operation.

3. The controller circuit of claim 2, wherein the predefined threshold voltage is about 150 mV.

4. The controller circuit of claim 2, wherein:
the digital controller is further configured to enter a third mode of operation when the digital controller exits the second mode of startup operation, the third mode of operation being a steady-state mode of operation.

5. The controller circuit of claim 1, further comprising:
a feedback circuit;
wherein the digital controller is further configured, in the second mode of startup operation, to:
detect, using the feedback circuit, a number of valleys of a quasi-resonant oscillating signal during an off-time of the main-switch; and
decrease the off-time duty-ratio value of the PWM signal by reducing, in the second mode of startup operation, the number of valleys detected in one or more subsequent off-times of the main-switch in one or more switching periods of the main-switch.

6. The controller circuit of claim 5, wherein:
the digital controller is further configured, in the second mode of startup operation, to reduce the number of valleys by one during each switching period of the main-switch.

7. The controller circuit of claim 1, further comprising:
a decoder circuit configured to receive, using a communications link, an encoded digital data stream comprising digital representations of the output voltage and to generate a digital voltage value using the encoded digital data stream;
wherein the digital voltage value is used as the indication of the output voltage.

8. The controller circuit of claim 7, wherein:
the decoder circuit receives, using the communications link, the encoded digital data stream from a secondary side of the power converter.

9. The controller circuit of claim 7, wherein:
the encoded digital data stream further comprises a digital representation of the reference voltage; and
the decoder circuit generates the reference voltage using the encoded digital data stream.

10. The controller circuit of claim 7, wherein:
the decoder circuit receives, using the communications link, the encoded digital data stream from the secondary side of the power converter after the output voltage has exceeded an under-voltage lockout threshold voltage value.

11. The controller circuit of claim 10, wherein:
the decoder circuit does not receive the encoded digital data stream from a secondary side of the power converter before the output voltage has exceeded the under-voltage lockout threshold voltage value.

12. A method, comprising:
generating, in a first mode of startup operation of a controller circuit, a pulse width modulation (PWM) signal with an incrementing on-time duty-ratio value;
controlling a main-switch of a power converter based on the PWM signal;
receiving an indication of an output voltage of the power converter;
exiting the first mode of startup operation when a difference between a reference voltage and the indication of the output voltage is not greater than an error window;
generating, in a second mode of startup operation of the controller circuit, the PWM signal with a decreasing off-time duty-ratio value; and
exiting the second mode of startup operation when a difference between the reference voltage and the indication of the output voltage is not greater than a predefined threshold voltage.

13. The method of claim 12, further comprising:
stopping a decrease of the off-time duty-ratio value of the PWM signal when the controller circuit exits the second mode of startup operation.

14. The method of claim 13, further comprising:
entering a third mode of operation when the controller circuit exits the second mode of startup operation, the third mode of operation being a steady-state mode of operation.

15. The method of claim 12, further comprising:
detecting, in the second mode of startup operation, a number of valleys of a quasi-resonant oscillating signal during an off-time of the main-switch; and
decreasing the off-time duty-ratio value of the PWM signal by reducing, in the second mode of startup operation, the number of valleys detected in one or more subsequent off-times of the main-switch in one or more switching periods of the main-switch.

16. The method of claim 15, further comprising:
reducing, in the second mode of startup operation, the number of valleys by one during each switching period of the main-switch.

17. The method of claim 12, further comprising:
receiving an encoded digital data stream comprising digital representations of the output voltage; and
generating a digital voltage value using the encoded digital data stream;

wherein the digital voltage value is used as the indication of the output voltage.

18. The method of claim 17, wherein:
the encoded digital data stream is received by the controller circuit from a secondary side of the power converter.

19. The method of claim 17, wherein:
the encoded digital data stream is received from a secondary side of the power converter after the output voltage has exceeded an under-voltage lockout threshold voltage value.

20. The method of claim 19, wherein:
the encoded digital data stream is not received by the controller circuit from the secondary side of the power converter before the output voltage has exceeded the under-voltage lockout threshold voltage value.

* * * * *